United States Patent [19]

Herndon et al.

[11] Patent Number: 4,868,421
[45] Date of Patent: Sep. 19, 1989

[54] BIMOS CIRCUIT THAT PROVIDES LOW POWER DISSIPATION AND HIGH TRANSIENT DRIVE CAPABILITY

[75] Inventors: William H. Herndon, Sunnyvale, Calif.; Robert J. Proebsting, Puyallup, Wash.

[73] Assignee: Fairchild Semiconductor Corporation, Santa Clara, Calif.

[21] Appl. No.: 17,634

[22] Filed: Feb. 24, 1987

[51] Int. Cl.[4] .................. H03K 19/02; H03K 19/086; H03K 17/60

[52] U.S. Cl. .................... 307/446; 307/443; 307/455; 307/544; 307/570

[58] Field of Search .............. 307/443, 446, 455, 544, 307/548, 557, 570, 495, 497, 355, 362

[56] References Cited

U.S. PATENT DOCUMENTS 3,546,485  12/1970  Davis ................................. 307/570
4,694,203   9/1987  Uragami et al. ..................... 307/570

Primary Examiner—William L. Sikes
Assistant Examiner—M. R. Wambach
Attorney, Agent, or Firm—Burns, Doane, Swecker & Mathis

[57] ABSTRACT

To reduce the total power dissipation of an emitter-follower driver or logic circuit, an MOS transistor is connected between an output terminal of the circuit and a suitable voltage source. The MOS transistor is operated in opposite phase to an emitter follower bipolar transistor that provides driving current to the output terminal, so that one is on while the other is off. The MOS transistor limits the current in the emitter follower transistor in either state of the circuit, thus reducing power dissipation. It also provides for a larger transient driving current to the output terminal, thus increasing the switching speed of the circuit.

22 Claims, 3 Drawing Sheets

BIMOS CIRCUIT THAT PROVIDES LOW POWER DISSIPATION AND HIGH TRANSIENT DRIVE CAPABILITY

BACKGROUND OF THE INVENTION

The present invention is directed to transistor circuits that provide a differential signal, such as emitter coupled logic (ECL) circuit configurations that are employed as logic gate and driver circuits.

Transistor circuits of the type to which the present invention is directed are typically employed to produce low and high level voltage output signals in response to one or more input signals. For example, they might be used as logic gates or as driver circuits to control output loads. In the operation of these types of circuits, a load capacitance connected to an output terminal of the circuit is charged from a lower output voltage level to a higher output voltage level by an emitter follower transistor. When the input signal changes state, current sinks or pull-down resistors are required to discharge the load capacitances from the higher output voltage level to the lower output voltage level.

The emitter follower transistor is controlled by a circuit which produces a differential output signal. For example, an emitter coupled logic (ECL) circuit can be employed to control the voltage which is applied to the base of the emitter follower transistor. In both the steady and transient states, the standard ECL circuit dissipates a significant amount of power. In addition, the presence of the current sink at the output terminal of the gate diverts driving current from the load capacitance. It is difficult to implement the sink with a bipolar npn transistor in an attempt to alleviate this problem. This difficulty arises from the fact that special circuitry is required to avoid saturation of the transistor and the excessive delays caused thereby.

BRIEF STATEMENT OF THE INVENTION

It is desirable to be able to reduce the power dissipation of logic and driver circuits as well as to eliminate the excessive delays that are encountered when these types of circuits switch from one output state to another. In accordance with the present invention, these objectives are achieved by connecting an MOS transistor between the output terminal of the circuit and a voltage source. The MOS transistor conducts in opposite phase to the output emitter follower transistor. The MOS transistor functions to limit the current in the output emitter follower in either output state, to thereby reduce the total power dissipation of the circuit. In addition, the MOS transistor provides selective control over the path of the driving current that is supplied to the load capacitance, enabling this capacitance to change its voltage level more rapidly in response to changes in the input signal.

Further features of the present invention and the advantages provided thereby are explained in detail hereinafter with reference to preferred embodiments illustrated in the accompanying drawings.

DESCRIPTION OF THE ILLUSTRATED EMBODIMENTS

Figure 1:
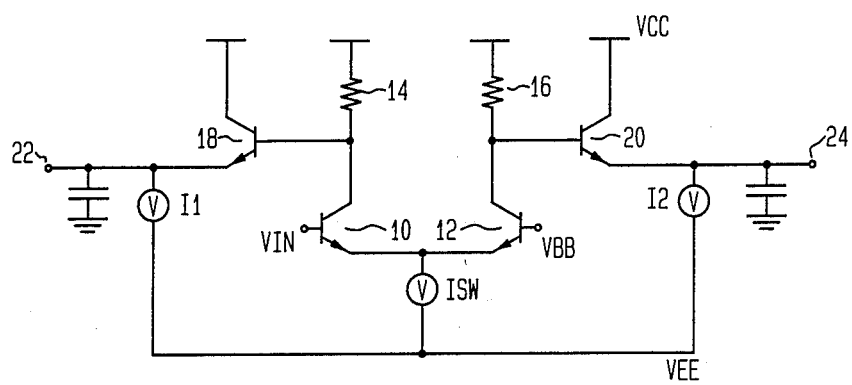
FIG. 1 is a schematic circuit diagram of a first embodiment a prior art ECL driver circuit.

To facilitate an understanding of the present invention and the advantages offered thereby, its implementation in connection with an ECL circuit will be described. Referring to FIG. 1, a conventional dual output ECL circuit includes a differential amplifier comprised of a pair of emitter coupled bipolar transistors 10 and 12. The base of the transistor 10 receives a control input signal VIN, and the base of the other transistor 12 is connected to a suitable reference voltage source VBB. The coupled emitters of these two transistors are connected to a low voltage power level VEE through an appropriate current sink ISW, and the collectors of these transistors are connected to a high voltage power level VCC by means of respective load resistors 14 and 16. The junction of each resistor 14 or 16 and the collector of the associated transistor 10 or 12 forms an output node of the differential amplifier.

A pair of emitter follower output transistors 18 and 20 have their collectors connected to the voltage level VCC. In the illustrated embodiment, these emitter follower transistors are NPN transistors. The base electrodes of these output transistors are respectively connected to the output nodes of the differential amplifier. The emitters of the two output transistors 18,20 respectively form the inverted output terminal 22 and the noninverted output terminal 24 of the ECL circuit. These output terminals are connected to the low voltage power level VEE through respective current sinks I1 and I2. Each output terminal presents a load capacitance which is represented as a discrete capacitor in the schematic circuit diagram of FIG. 1.

In operation, when the input signal VIN is greater than the reference voltage VBB, the transistor 10 is rendered conductive and the transistor 12 of the differential amplifier is turned off. The transistors 18 and 20 operate in the "emitter follower" mode of operation where the output terminals 22 and 24 follow the base voltages of the transistors 18 and 20 with a D.C. translation equal to the "on" base emitter voltage of the transistors 18 and 20. The currents I1 and I2 at the emitters of these transistors are usually substantially higher than the current ISW. The emitter follower transistors provide current gain so that the currents I1 and I2 do not substantially affect the voltages at the bases of the transistors 18 and 20.

If the input signal VIN now changes state so that it is lower than the reference voltage VBB, the conductive and non-conductive states of the transistors 10 and 12 are transposed. Accordingly, the output transistor 18 charges the load capacitance at the terminal 22 from the low voltage level to the higher output voltage level. At the same time, the output transistor 20 allows the current sink I2 to discharge the load capacitance at the terminal 24 from the higher voltage level to the lower output voltage level In a similar manner, when the input signal again changes state, the current sink I1 discharges the load capacitance at the terminal 22.

Because currents through the sinks I1 and I2 exist even in the quiescent state of the circuit, the total power dissipation in the circuit is (VCC−VEE)*(ISW+I1+I2), where ISW is the current that flows through the conducting transistor 10 or 12 in the differential amplifier. In addition, the presence of the current sinks I1 and I2 causes some of the driving current supplied through the emitter follower output transistors to be diverted away from the load capacitance. This results in a lengthening of the time it takes the load capacitance to be charged to the high voltage level.

Figure 2:
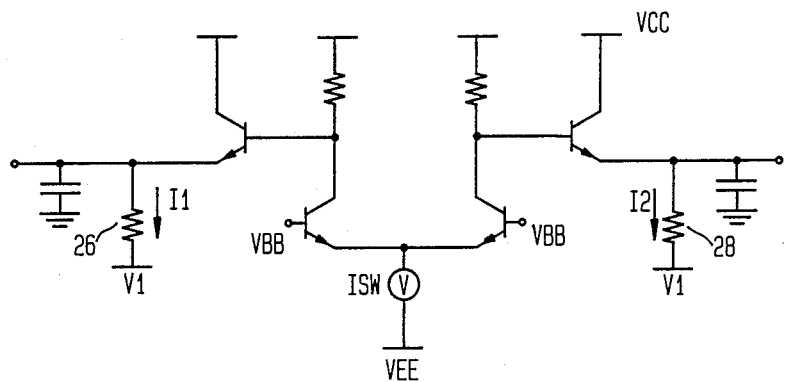
FIG. 2 is a schematic circuit diagram of a second embodiment prior art ECL driver circuit.

In an effort to reduce the total power dissipation of the ECL circuit, the modified circuit shown in FIG. 2 has been employed in the past. In this circuit, the output current sinks I1 and I2 are replaced by pull-down resistors 26 and 28 that are connected to an appropriate power supply V1. The voltage of this power supply is greater than that of VEE, but less than VCC. In this circuit, the total power dissipation is somewhat less, i.e. (VCC−VEE)*ISW+(VCC−V1)*(I1+I2). However, the presence of the current paths provided by the pull-down resistors still detracts from the total driving force that can be applied to the load capacitances, and consumes power in both the quiescent and transient states.

Figure 3:
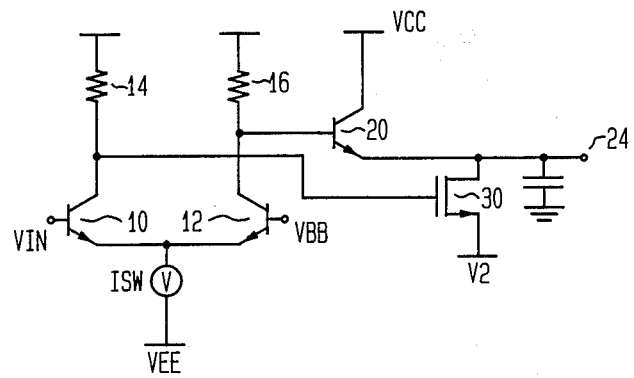
FIG. 3 is a schematic circuit diagram of a basic ECL circuit which embodies the principles of the present invention.

In accordance with the present invention, it is possible to increase the transient driving force that is applied to the load capacitor and to reduce the D.C. power dissipation by replacing the current sinks I1 and I2, or the pull down resistors 26 and 28, by MOS transistors. Referring to FIG. 3, an ECL circuit embodying the principles of the invention and having a single, non-inverting output terminal 24 is illustrated. This circuit includes the differential amplifier comprised of the transistors 10 and 12, as well as the emitter follower output transistor 20. In addition, an NMOS transistor 30 has its drain electrode connected to the emitter of the output transistor 20, i.e., to the output terminal 24, and its source electrode connected to a suitable voltage source V2. The gate electrode of the transistor 30 is connected to the collector of the transistor 10 so that it is driven in opposite phase to the base of the output transistor 20, i.e., when the base of the NPN emitter follower transistor 20 is high the gate of the NMOS transistor 30 ( is low, and when the base of the NPN transistor 20 is low the gate of the NMOS transistor 30 is high.

In operation, when the output transistor 20 is conductive to place the output terminal 24 in the high voltage state, the D.C. current in the emitter follower transistor 20 is limited by the low drain current of the MOS transistor 30. This current is low because the gate of the NMOS transistor 30 is in the low voltage state. The output voltage of the source V2, the threshold voltage of the NMOS transistor 30 and the values of the resistors 14 and 16 are suitably chosen with reference to the particular operating characteristics of the NPN and NMOS transistors so as to limit the drain current of the transistor 30 in the high voltage output state and limit the collector and emitter currents of the output transistor 20 in the low voltage output state. More particularly, the voltage source V2 is preferably chosen such that when the current ISW flows through the resistor 16, i.e., the output terminal 24 is in the low voltage state, the voltage difference between the base and emitter of the transistor 20 is limited to such a value that the collector and emitter currents of this transistor are low. This relationship should hold true even if the MOS transistor 30 is highly conductive and the voltage at the output terminal 24 is essentially the same as the voltage V2.

Also, the value of the voltage V2 is determined with reference to the high output state. In this condition, the current ISW flows through the resistor 14. The voltage difference between the gate and the source of the transistor 30 should preferably be close to the threshold voltage of this transistor, so as to minimize its drain current.

The operation of the circuit of FIG. 3 will be explained with reference to the case in which the input signal VIN is initially at a low logic level. In this state, the transistor 10 is off and the transistor 12 is on, so that the current ISW is steered through the resistor 16 and negligible current flows through the resistor 14. The voltage at the collector of the transistor 10 is at approximately VCC, and the voltage at the collector of transistor 12 is at VCC−$V_{16}$, where $V_{16}$ is the voltage across the resistor 16. For example, VCC can be zero volts (ground) and $V_{16}$ can be about 900 mV, so that the voltage at the collector of the transistor 12 (i.e. the base of the transistor 20) is −0.9V. The output signal at the terminal 24 is at a low logic level that is at or very close to the voltage V2. The low base-to-emitter voltage of the transistor 20 limits its collector and emitter currents to a very small value during this state. For example, if V2 is −1.5 volts, $V_{BE}$ of the transistor 20 will be 0.6V.

When the input signal goes to a logic high state, the transistor 10 turns on and the transistor 12 turns off. The voltage at the collector of the transistor 12 rises and increases the base-to-emitter voltage of the transistor 20 such that a large current is available to charge the parasitic capacitance at the output terminal 24. For example, at room temperature an increase of the base-to-emitter voltage by about 60mV increases the collector current by a factor of 10.

At the same time, the voltage at the collector of the transistor 10 falls and the MOS transistor 30 turns off, therefore having no deleterious effect upon the transient driving force that is provided by the transistor 20. The large transient current from the transistor 20 is self-limiting in the fashion of standard emitter follower configurations, so that the transistor 20 can no longer provide a large transient driving force once the terminal 24 is charged to the logic high level.

If the input signal VIN now goes from the logic high to the logic low state, the transistor 10 is turned off and the transistor 12 turns on. The current ISW is switched from the resistor 14 to the resistor 16, causing the voltage at the collector of the transistor 10 to rise and the voltage at the collector of the transistor 12 to fall. When the voltage at the collector of the transistor 10 rises, the gate-to-source voltage of the transistor 30 is increased such that it becomes highly conductive to connect the output terminal 24 to the voltage source V2. This provides a large transient pull-down current to the parasitic capacitance at the output terminal 24. The falling voltage at the collector of the transistor 12 reduces the base voltage of the transistor 20, and this transistor becomes nonconductive so that it does not subtract from the current available through the transistor 30.

From the foregoing, it will be appreciated that the circuit configuration illustrated in FIG. 3 provides a large transient driving current for both positive and negative transitions in the output signal without requiring a large power dissipation in the steady state condition. The transient drive current that is available to charge or discharge the output terminal 24 substantially exceeds any steady state current that passes through the bipolar and MOS transistors. In addition, the MOS transistor 30 does not exhibit speed penalties if the drain to source voltage approaches zero as does a bipolar transistor if its collector to emitter voltage is allowed to approach zero (a condition called saturation). This feature eliminates the excessive storage delays that would be associated with the circuit of FIG. 3 if a bipolar transistor were substituted for the MOS transistor 30 in that circuit.

By operating at typical ECL voltage levels, there is very little voltage stress on the transistor 30. For example, the maximum gate-to-source and drain-to-source voltages might be 1.7 and 0.9 volts, respectively. These voltage levels offer significant flexibility in the thickness of the gate oxide an the length of the channel for the transistor 30. In other words, a short gate length can be combined with a thin gate oxide without encountering some of the penalties or compromises that are typical in prior art arrangements which use 5 volts drain to source or gate to source voltage. Furthermore, thin gate oxides and short channel lengths offer increased transconductance, excellent high frequency characteristics and allow the use of small logic swings characteristic of ECL circuits.

The output voltage level that appears at the terminal 24 is referenced to the positive voltage conductor connected to the resistor 16. On the other hand, most of the transient current supplied during the switching of the output signal flows through the conductor connected to the collector of the transistor 20. It may be appropriate to separate the conductor that is connected to the resistors 14 and 16 from the conductor connected to the collector of the transistor 20 to thereby decouple noise that may be caused by large transient currents from the output signal referenced to the resistors 14 and 16.

The circuit illustrated in FIG. 3 provides a noninverted output signal relative to the input signal VIN. To provide an inverted output signal, the connections for the base of the transistor 20 and the gate of the transistor 30 can be transposed.

Figure 4:
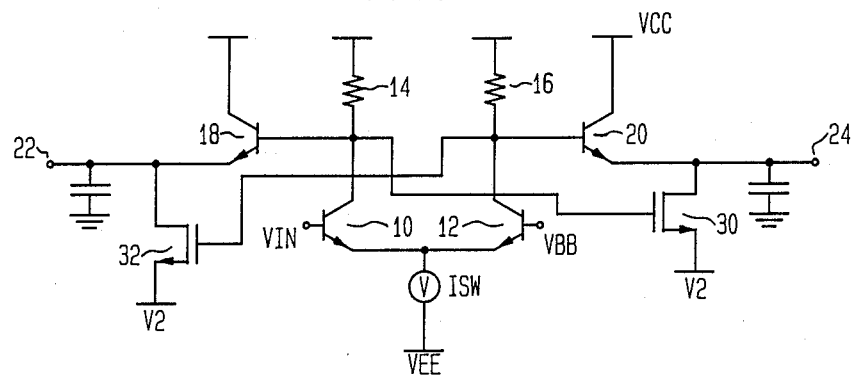
FIG. 4 is a schematic circuit diagram of an ECL circuit according to the invention that provides both inverted and non-inverted output signals.

Furthermore, it is possible to provide both inverting and non-inverting output signals. A circuit arrangement for accomplishing this result is illustrated in FIG. 4. In this circuit, two emitter follower transistors 18 and 20 are provided, each being respectively connected to one of the output nodes of the differential amplifier. In addition, two MOS transistors 30 and 32 are respectively coupled to the emitter follower output transistors 20 and 18 and conduct in opposite phase to their associated emitter follower transistors, as described previously.

Figure 5:
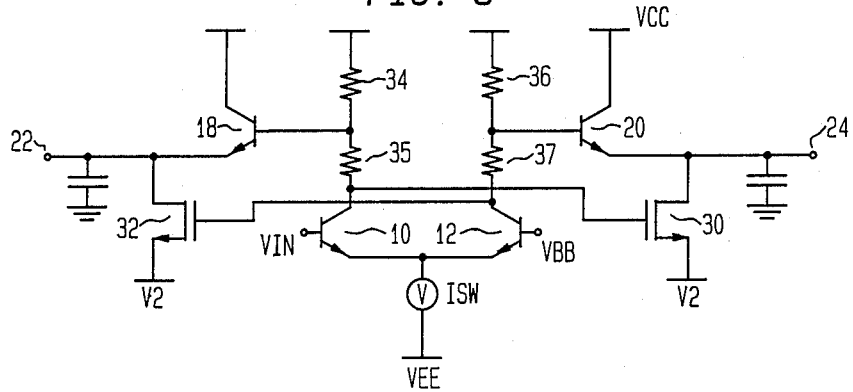
FIG. 5 is a schematic circuit diagram of a first variation of the circuit of FIG. 4.

With reference to the circuit of FIG. 3, it may be desirable to have the voltage change at the gate of the transistor 30 be larger than the voltage change at the base of the emitter follower transistor 20. This can be accomplished by making the resistor 14 larger than the resistor 16. It is not possible to provide such an arrangement with the circuit of FIG. 4. However, such a voltage differential can be provided by modifying the circuit of FIG. 4 as shown in FIG. 5. In this circuit, the resistors 14 and 16 are each replaced by two series resistors 34,35 and 36,37. By splitting the resistors in this fashion, greater independence is provided in the choice of the output pull-down gate voltage to the transistors 30 and 32 and the output pull-up base voltage to the emitter follower transistors 18 and 20.

With reference again to the circuit of FIG. 4, in certain cases it may be found that the capacitive loading provided by the gates of the transistors 30 and 32 affect the time constant of the driving signal that is provided to the bases of the emitter follower output transistors 18 and 20. If this capacitive loading is determined to be disadvantageous in some situations, it can be eliminated by means of the circuit configuration shown in FIG. 6. In this circuit, the gates of the transistors 30 and 32 are connected to the emitters of the transistors 18 and 20, respectively. With this configuration, the threshold voltages of the MOS transistors 30 and 32 should be appropriatelY adjusted to account for the base-to-emitter voltage shift produced by the transistors 18 and 20. With this arrangement, the capacitive loading is no longer present at the base terminals of the emitter follower output transistors 18 and 20, and so they are able to respond quickly to changes in the output signals from the differential amplifier.

Figure 6:
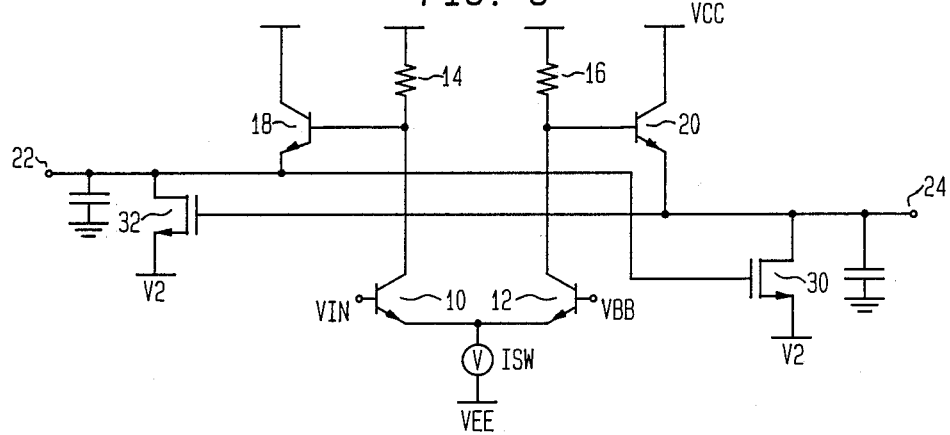
FIG. 6 is a schematic circuit diagram of a second variation of the circuit of FIG. 4.
Figure 7:
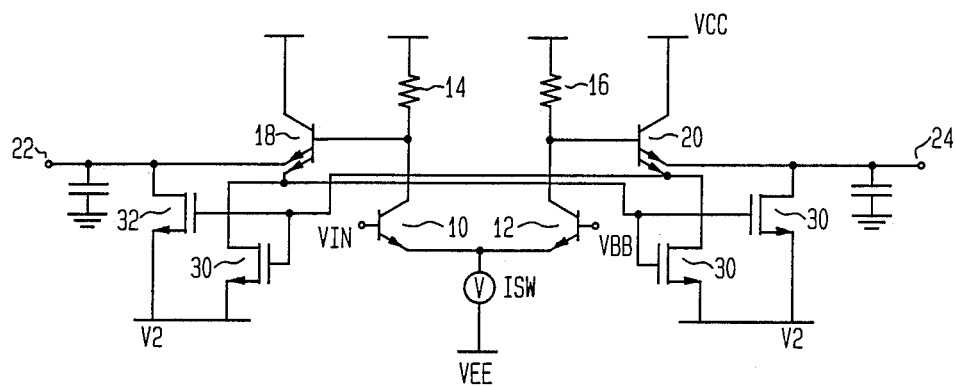
FIG. 7 is a schematic circuit diagram of a further variation of the circuit of FIG. 6.

In a modification to the circuit of FIG. 6, the transistors 18 and 20 can be constructed as plural emitter transistors, as shown in FIG. 7. With this arrangement, one emitter of each output transistor can be used in the conventional fashion to control the voltage at one of the output terminals 22 and 24. The other emitter of each output transistor is used to drive the gate electrodes of the MOS transistors 30 and 32. Since these latter emitter terminals are not loaded by the parasitic capacitance of the output terminals, the gate voltages of the transistors 30 and 32 will change quickly, thus avoiding any delays in the response of these transistors. To ensure that each emitter of the emitter-follower transistors 18 and 20 behave in a similar manner, additional pull-down MOS transistors 31 and 33, corresponding to the transistors 30 and 32, respectively, are provided for the extra emitters of the multiple emitter transistors.

From the foregoing, it can be seen that the present invention provides a transistor circuit configuration which offers a large transient driving current to enable the output state of the circuit to be rapidly changed without incurring large power dissipation. It will be appreciated by those of ordinary skill in the art that the present invention can be embodied in other specific forms without departing from the spirit or essential characteristics thereof. In particular, although described with reference to its implementation in an ECL circuit, the fundamental concepts which underly the invention can be applied to any transistor circuit which provides a differential signal, e.g. a TTL circuit. In accordance with the invention, the signal at one node of the differential circuit controls the operation of the emitter follower pull up transistor and the signal at the complementary node controls the MOS pull down transistor.

In addition, the differential circuit is not limited to use as a driver circuit to charge a load capacitance. By connecting multiple input transistors 10 in parallel, the circuit can be used to provide a logic OR or NOR function, and in virtually any standard ECL circuit, the NMOS transistor can be substituted for a current source or resistor pulldown to substantially reduce power dissipation.

Similarly, the practical implementations of the invention are not limited to the use of NPN bipolar transistors and N-channel MOS transistors as shown in the embodiments of FIGS. 3–7. Rather it is possible to use PNP and PMOS transistors in place of the NPN and NMOS transistors, respectively, in the circuits of these figures and still achieve the advantages of the invention.

Figure 8:
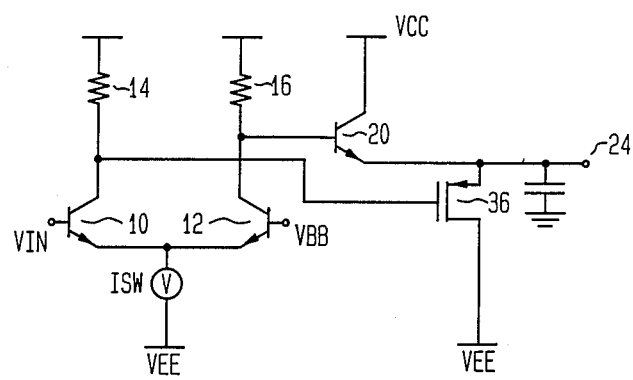
FIG. 8 is a schematic circuit diagram of an embodiment of the invention which uses p-channel MOS transistors.

Furthermore, it is possible to employ a PMOS transistor in a source follower configuration in place of the NMOS pull-down transistor 30 of the FIG. 3 embodiment. Such a variation of the invention is shown in FIG. 8. As can be seen in the figure, the gate of the PMOS transistor 36 is connected to the same node as the base of the NPN emitter-follower transistor 20, rather than the complementary node as in the embodiment of FIG. 3. This is done to ensure that the emitter-follower transistor 20 conducts in opposite phase to the PMOS pull-down transistor 36. In all other respects the circuits of FIGS. 3 and 8 are the same.

The modification of FIG. 8 may be more attractive in some cases because it is generally easier to integrate a PMOS transistor into a high frequency bipolar process than an NMOS transistor. Further, the approach of FIG. 8 does not require a separate supply voltage V2, and the threshold voltage of the PMOS transistor can be adjusted through appropriate process designs and thus may be more convenient to use than a PNP bipolar transistor for the same application.

The presently disclosed embodiments are therefore considered in all respects to be illustrative and not restrictive. The scope of the invention is indicated by the appended claims rather than the foregoing description and all changes that come within the meaning and range of equivalents thereof are intended to be embraced therein.

What is claimed is:

1. A transistor circuit, comprising:
   a bipolar emitter follower transistor having a collector connected to a first voltage source and an emitter connected to an output terminal of the circuit;
   an MOS transistor having one of its drain and source electrodes connected to said output terminal and the other of its drain and source electrodes connected to a second voltage source; and
   a differential amplifier having a pair of emitter-coupled bipolar transistors whose collectors are respectively connected to two complementary output nodes for applying drive voltages from at least one of said output nodes to the base of said bipolar transistor and the gate electrode of said MOS transistor in response to a control input signal such that the transient drive current available to charge or discharge the output terminal substantially exceeds any steady state current passing through the bipolar and MOS transistors.

2. The transistor circuit of claim 1 wherein at least one of said emitter-coupled transistors receives said control input signal at its base.

3. The circuit of claim 1 wherein the base of said emitter follower transistor is connected to the collector of one of said emitter-coupled transistors and the gate of said MOS transistor is connected to the collector of the other emittercoupled transistor.

4. The circuit of claim 1 wherein the gate of said MOS transistor is connected to the collector of one of said emitter coupled transistors and the base of the emitter follower transistor is connected to the collector of the other emittercoupled transistor by means of a resistor connected in series between said base and said collector of said other emitter-coupled transistor.

5. The circuit of claim 1 wherein said emitter follower transistor is an NPN transistor and said MOS transistor is an NMOS transistor.

6. The circuit of claim 1 wherein said emitter follower transistor is an NPN transistor and said MOS transistor is a PMOS transistor.

7. The circuit of claim 1 wherein said control means controls said bipolar and MOS transistors such that they are rendered conductive in opposite phase to one another.

8. An emitter-coupled logic gate circuit which provides both inverted and non-inverted output signals in response to an input signal comprising:
   a differential amplifier having a pair of bipolar transistors whose emitters are connected in common and whose collectors are respectively connected to first and second complementary nodes, at least one of said bipolar transistors receiving said input signal at its base electrode;
   first and second bipolar, emitter-follower output transistors whose bases are respectively connected to said first and second nodes and whose emitters are connected to complementary output terminals of the circuit;
   a first NMOS transistor having a drain-source current path connected between the emitter of said first output transistor and a second voltage source, and a gate which receives a voltage related to the voltage at said second node; and
   a second NMOS transistor having a drain-source current path connected between the emitter of said second output transistor and said second voltage source, and a gate which receives a voltage determined by the voltage at said first node.

9. The gate circuit of claim 8 wherein said gates of said first and second NMOS transistors are connected to said second and first nodes, respectively.

10. The gate circuit of claim 8 further comprising a resistor connected in series between the collector of each of said pair of transistors of the amplifier and the node to which said collector is connected, and wherein the gate electrodes of said NMOS transistors are respectively connected to the junction between one of said collectors and the series resistor connected thereto.

11. An emitter-coupled logic gate circuit which provides both inverted and non-inverted output signals in response to an input signal comprising:
   a differential amplifier having a pair of bipolar transistors whose emitters are connected in common and whose collectors are respectively connected to first and second complementary nodes, at least one of said bipolar transistors receiving said input signal at its base electrode;
   first and second bipolar, emitter-follower output transistors whose bases are respectively connected to said first and second nodes and whose emitters are connected to complementary output terminals of the circuit;
   a first NMOS transistor having a drain-source current path connected between the emitter of said first output transistor and a second voltage source, and a gate connected to an emitter of said second output transistor to thereby receive a voltage required to the voltage at said second node; and
   a second NMOS transistor having a drain-source current path connected between the emitter of said second output transistor and said second voltage source, and a gate connected to an emitter of said first output transistor to thereby receive a voltage determined by the voltage at said first node.

12. The gate circuit of claim 11 wherein each of said output transistors has plural emitters, and wherein one of said plural emitters is connected to an output terminal of the circuit and the other of said plural emitters is connected to the gate of the one of said first and second NMOS transistors that is connected to the other output terminal of the circuit.

13. An emitter-coupled driver circuit which provides a binary level output signal in response to an input signal, comprising:
- a differential amplifier having a pair of bipolar transistors whose emitters are connected in common and whose collectors are respectively connected to first and second complementary nodes, one of said bipolar transistors receiving said input signal at its base electrode and the other of said bipolar transistors receiving an input reference signal at its base electrode;
- a bipolar, emitter-follower output transistor whose base is connected to said first node, whose collector is connected to a constant voltage source, and whose emitter is connected to an output terminal of the circuit; and
- an MOS transistor having a drain-source current path connected between the emitter of said output transistor and a second voltage source, and a gate which receives a voltage determined by the voltage at said second node.

14. The driver circuit of claim 13 wherein said gate of said MOS transistor is connected to said second node.

15. An emitter-coupled driver circuit which provides a binary level output signal in response to an input signal, comprising:
- a differential amplifier having a pair of bipolar transistors whose emitters are connected in common and whose collectors are respectively connected to first and second complementary nodes, one of said bipolar transistors receiving said input signal at its base electrode and the other of said bipolar transistors receiving an input reference signal at its base electrode;
- a bipolar, emitter-follower output transistor whose base is connected to said first node, whose collector is connected to a constant voltage source, and whose emitter is connected to an output terminal of the circuit; and
- an MOS transistor having a drain-source current path connected between the emitter of said output transistor and a second voltage source, and a gate which receives a voltage determined by the voltage at one of said nodes.

16. The driver circuit of claim 15 wherein said output transistor is an NPN transistor and said MOS transistor is a PMOS transistor.

17. The driver circuit of claim 16 wherein said gate of said MOS transistor is connected to said first node.

18. The driver circuit of claim 16 wherein said gate of said MOS transistor is connected to an emitter of said output transistor.

19. A transistor circuit, comprising:
- a differential amplifier circuit having at least one input signal terminal, and two complementary output nodes and producing a differential signal at said output nodes;
- an emitter follower pull-up transistor having a base connected to one of said complementary nodes, a collector connected to a first voltage source and an emitter connected to an output terminal of said transistor circuit; and
- an NMOS pull-down transistor having a gate connected to the other of said complementary nodes and a drain-source current path connected between said output terminal and a second voltage source.

20. The circuit of claim 19 wherein said transistor circuit comprises a logic gate.

21. The circuit of claim 19 wherein said transistor circuit comprises a current driver which charges a load capacitance at said output terminal.

22. A transistor circuit, comprising:
- a bipolar emitter follower transistor having a collector connected to a first voltage source and an emitter connected to an output terminal of the circuit;
- an MOS transistor having one of its drain and source electrodes connected to said output terminal and the other of its drain and source electrodes connected to a second voltage source; and
- control means comprising an emitter-coupled logic circuit including a differential amplifier having a pair of emitter-coupled bipolar transistors whose collectors are respectively connected to two complementary output nodes, with the base of said emitter follower transistor being connected to the collector of one of said emitter-coupled transistors, and further comprising a bipolar transistor having a base connected to the collector of the other emitter-coupled transistor and an emitter connected to the gate of said MOS transistor, to thereby apply respective drive voltages at said output nodes to the base of said bipolar transistor and the gate electrode of said MOS transistor in response to a control input signal received at the base of one of said emitter-coupled transistors such that the transient drive current available to charge or discharge the output terminal substantially exceeds any steady state current passing through the bipolar and MOS transistors.

* * * * *